United States Patent [19]
Ishii

[11] Patent Number: 5,377,055
[45] Date of Patent: Dec. 27, 1994

[54] CIRCUIT APPARATUS FOR DRIVING A MAGNETIC HEAD

[75] Inventor: Kazuyoshi Ishii, Tokyo, Japan

[73] Assignee: Canon Kabushiki Kaisha, Tokyo, Japan

[21] Appl. No.: 150,239

[22] Filed: Nov. 9, 1993

Related U.S. Application Data

[63] Continuation of Ser. No. 961,825, Oct. 16, 1992, abandoned.

[30] Foreign Application Priority Data

Oct. 31, 1991 [JP] Japan .................................. 3-311368

[51] Int. Cl.$^5$ ............................ G11B 5/02; G11B 5/09
[52] U.S. Cl. ...................................... 360/59; 360/46; 360/67; 360/68
[58] Field of Search ....................... 360/46, 59, 61, 67, 360/68

[56] References Cited

U.S. PATENT DOCUMENTS 5,229,902 7/1993 Zucker et al. .................. 360/59 X

FOREIGN PATENT DOCUMENTS 0365891  5/1990  European Pat. Off. .
63-94406  4/1988  Japan .
WO9005980 5/1990  WIPO .

OTHER PUBLICATIONS

Patent Abstracts of Japan, Kokai No. 63-244402, vol. 13, No. 54, Feb. 1989.

Patent Abstracts of Japan, Kokai No. 03-157839, vol. 15, No. 395, Oct. 1991.

*Primary Examiner*—Donald Hajec
*Assistant Examiner*—T. N. Forbus, Jr.
*Attorney, Agent, or Firm*—Fitzpatrick, Cella, Harper & Scinto

[57] ABSTRACT

A circuit apparatus for driving a magnetic head to generate a magnetic field wherein a driving frequency of the magnetic head is increased and a recording density of an information recording medium is raised. In this circuit apparatus, a bridge circuit is constructed in which a chief coil for generating a magnetic field is arranged between a first connection node disposed between a serially connected first auxiliary coil and first switch element and a second connection node disposed between a serially connected second auxiliary coil and second switch element, and the magnetic field is modulated in accordance with an information signal by on-off control of the first and second switch elements to change the direction of current flowing in the chief coil. Further, third and fourth switch elements are respectively connected in parallel with the first and second switch elements so that a current path of the chief coil is separated from respective current paths of the auxiliary coils. Thus, the current path of current through the auxiliary coil is isolated. Or, there are provided circuits for respectively supplying currents to the chief coil through the first and second auxiliary coils and circuits for respectively supplying currents to the chief coil without passing through the first and second auxiliary coils.

27 Claims, 5 Drawing Sheets

CIRCUIT APPARATUS FOR DRIVING A MAGNETIC HEAD

This application is a continuation of prior application Ser. No. 07/961,825 filed Oct. 16, 1992, now abandoned.

BACKGROUND OF THE INVENTION

1. Field of the Invention

The present invention relates to a circuit apparatus for driving a magnetic head to be used for magnetic modulation in a magnetic modulation type optomagnetic recording apparatus.

2. Related Background Art

Conventionally, optical modulation systems, magnetic-field modulation systems and the like are known as a recording system of an optomagnetic recording apparatus. Among them, the magnetic-field modulation system is particularly advantageous in its recording speed, for example, since new data can be directly overwritten onto old data in this modulation system. FIG. 1 illustrates a schematic structure of such a conventional magnetic-field modulation system. In FIG. 1, reference numeral 1 designates an optomagnetic disc to be used as an information recording medium, and reference numeral 2 designates an optomagnetic recording layer formed in the disc 1. In this structure, a magnetic head 6 is disposed above the optomagnetic disc 1, and an optical head 4 is disposed below the disc 1, opposite to the magnetic head 6. The optical head 4 causes a laser beam 7 from a semiconductor laser, which is arranged in the optical head 4 as a light source, to be applied onto the recording layer 2 as a minute light spot so that the temperature of a recording portion is raised to a value higher than the Curie temperature. On the other hand, the magnetic head 6 generates a bias magnetic field modulated in accordance with information to be recorded by driving a driver circuit 3, and applies this bias magnetic field to a temperature-raised portion of the recording layer 2. As a result, the orientation of magnetization in the temperature-raised portion of the recording layer 2 is changed to a direction of the bias magnetic field, and the information is recorded in the recording layer 2.

As a driving apparatus for a magnetic head of a magnetic-field modulation system, an apparatus as disclosed in, for example, Japanese Patent Laid-open No. 63-94406 is known. FIG. 2 shows a circuit diagram of this driving apparatus. In FIG. 2, reference symbol $L_H$ designates a chief coil for generating a bias magnetic field, reference symbol $L_1$ and $L_2$ respectively designate auxiliary coils for speedily changing over a magnetic field, reference symbol $SW_1$ and $SW_2$ respectively designate switch elements for changing the direction of current in the chief coil $L_H$, and reference symbol $R_1$ and $R_2$ respectively designate resistors for limiting current. Values of inductances of the auxiliary coils $L_1$ and $L_2$ are set to values larger than the inductance of the chief coil $L_H$. In this driving apparatus, the switch elements $SW_1$ and $SW_2$ are controlled to be alternately turned on or off (closed or open), and the polarity of the generated magnetic field is switched in accordance with information to be recorded by switching the direction of current in the chief coil $L_H$. In more detail, current paths $CH_1$ and $CH_4$ are closed or established while current paths $CH_2$ and $CH_3$ designated by dashed lines are open or nonexistent, when the switch element $SW_1$ is closed and the switch element $SW_2$ is opened. Then, since current is supplied to the chief coil $L_H$ due to the establishment of the current path $CH_1$, a magnetic field in accordance with the direction of the current is generated by the chief coil $L_H$.

On the other hand, when the switch element $SW_1$ is opened and the switch element $SW_2$ is closed, the current paths $CH_2$ and $CH_3$ are closed or established while the current paths $CH_1$ and $CH_4$ are open or nonexistent. As a result, current opposite in direction to the abovementioned current (i.e., a reverse current) flows through the chief coil $L_H$ due to the establishment of the current path $CH_2$, and a magnetic field whose polarity is reversed is generated. Here, since the inductances of the auxiliary coils $L_1$ and $L_2$ are larger than the inductance of the chief coil $L_H$, the flowing currents are respectively maintained at approximately constant values, while the current path is changed from $CH_1$ to $CH_3$, and from $CH_4$ to $CH_2$ as the switch elements $SW_1$ and $SW_2$ are changed over. Therefore, if the on-off time of the switch elements $SW_1$ and $SW_2$ is made sufficiently short, the direction of the current flowing through the chief coil $L_H$ can be reversed in a very short time without increasing the voltage of a DC source V. This is effective for preventing mistakes in recording information signals in order to achieve a desired signal recording.

However, when the switch element is, for example, a field effect transistor, a stray capacitance between drain and source appears even if the switch element is actually open. As a result, as shown in FIG. 3, a vibration phenomenon due to such stray capacitance and the inductance component of the chief coil $L_H$ occurs, and the time required for reversing the current of the chief coil $L_H$ is determined by a period of this vibration. Therefore, in order to shorten the reversal time, a switch element having a speedy switching time and a small stray capacitance should be used. Further, the vibration is gradually attenuated as its energy is consumed, but in order to prompt this attenuation, a resistor (not shown) should be used to consume the vibration energy. Thus, current shown in FIG. 3 is supplied to the chief coil $L_H$ by alternate on-off control of the switch elements $SW_1$ and $SW_2$, and a magnetic field corresponding to the direction of this current is generated. In FIG. 3, a dashed line indicates a vibration wave shape due to the inductance and the stray capacitance, and a solid line indicates a current wave shape in a case where the vibration is speedily attenuated using the resistor and the like.

In the prior art magnetic head driving apparatus, however, most of the magnetic energy ($\frac{1}{2} \cdot LI^2$; L is an inductance of the chief coil $L_H$ and I is the current passing through it) stored in the chief coil $L_H$ is consumed in the resistor and so forth in a process of the vibration phenomenon, and at this time energy of $\frac{1}{2} \cdot LI^2$ is momentarily supplied from the auxiliary coil to the chief coil $L_H$ as current in an opposite direction, thereby reversing the current through the chief coil $L_H$. Therefore, the reduced energy of $\frac{1}{2} \cdot LI^2$ must be supplied to the auxiliary coil from the DC source V by the next current reversal. Generally, when a current supply is performed from a source having a voltage of V to an auxiliary coil having an inductance of $L_A$, the rate of change $\Delta i/\Delta t$ of the current relative to time is $V/L_A$, and hence the energy supply from the DC source having a low voltage to the auxiliary coil having a large inductance takes a considerable time. Therefore, in a case where the current reversal is conducted at a high repetitive frequency, current supplied to the chief coil is reduced since the current reversal is performed in a state in which the energy supply to the auxiliary coil inadequate. Thus, a normal recording of information becomes impossible. Actually, when the voltage of the source V is 5V, the inductance of the chief coil $L_H$ is 1 μH and the current supplied to the chief coil is 0.2A, an upper limit of the driving frequency is about 5 MHz. As this frequency increases, the current decreases and information recording degradation occurs.

SUMMARY OF THE INVENTION

It is an object of the present invention to provide a circuit apparatus for driving a magnetic head in which a driving frequency of the magnetic head can be greatly increased and a recording speed can be increased likewise.

According to one aspect of the present invention, in a circuit apparatus for driving a magnetic head for achieving the object of the present invention, a bridge circuit is constructed in which a chief coil for generating a magnetic field is arranged between a first connection portion (element) disposed between a serially connected first auxiliary coil and first switch element and a second connection portion (element) disposed between a serially connected second auxiliary coil and second switch element, and the magnetic field is modulated in accordance with an information signal by on-off control of the first and second switch elements to change the direction of current flowing in the chief coil. Further, third and fourth switch elements are respectively connected in parallel with the first and second switch elements so that a current path of the chief coil is separated from respective current paths of the auxiliary coils. Thus, the current path of current through an auxiliary coil can be isolated.

According to another aspect of the present invention, in a circuit apparatus for driving a magnetic head for achieving the object of the present invention, a bridge circuit is constructed in which a chief coil for generating a magnetic field is arranged between a first connection node disposed between a serially connected first auxiliary coil and first switch element and a second connection node disposed between a second auxiliary coil and second switch element, and the magnetic field is modulated in accordance with an information signal by on-off control of the first and second switch elements to change the direction of current flowing in the chief coil. Further, circuits are constructed for respectively supplying current to the chief coil through the first and second auxiliary coils and other circuits are constructed parallel to the auxiliary coils for respectively supplying current to the chief coil without passing through the first and second auxiliary coils.

According to yet another aspect of the present invention, a circuit apparatus for generating a magnetic field to drive a magnetic head is provided which includes chief coil means for generating the magnetic field and switch means for switching a direction of current in the chief coil means. Further, auxiliary coil means supplements the energy of the chief coil means at a time when switching occurs, and isolation means establishes a current path through the auxiliary coil means separate from a current path through the chief coil means.

These advantages and others will be more readily understood in connection with the following detailed description of the preferred embodiments in conjunction with the drawings.

DESCRIPTION OF THE PREFERRED EMBODIMENT

Figure 1:
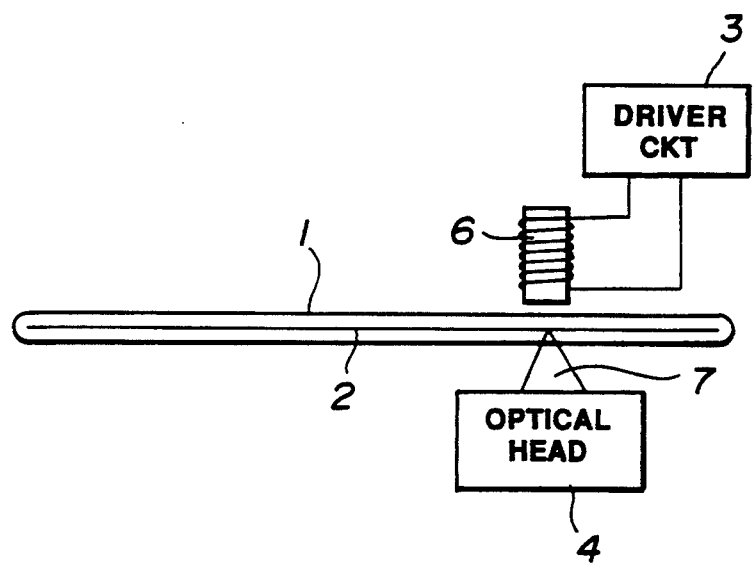
FIG. 1 is a schematic view showing a prior art magnetic-field modulation system.
Figure 2:
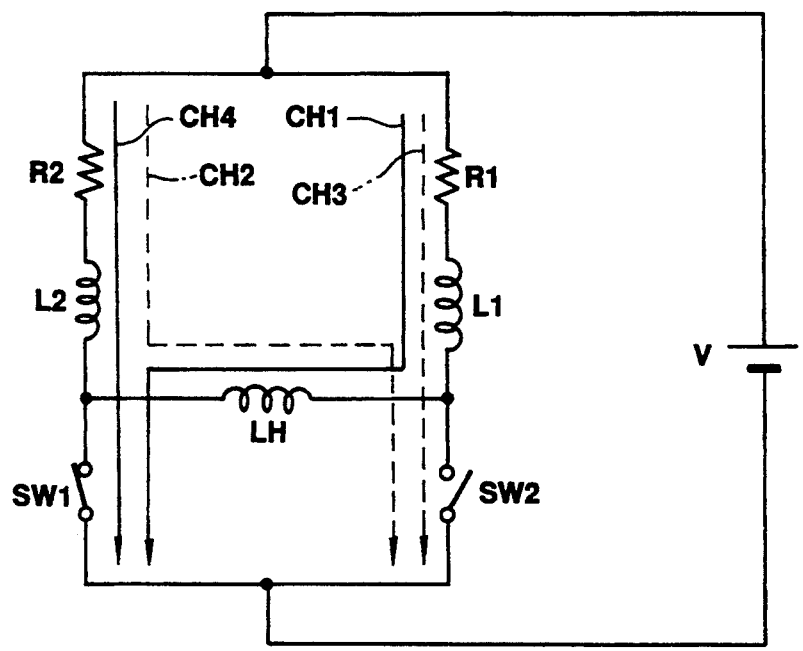
FIG. 2 is a circuit diagram showing a magnetic head driving apparatus of the prior art magnetic-field modulation system.
Figure 3:
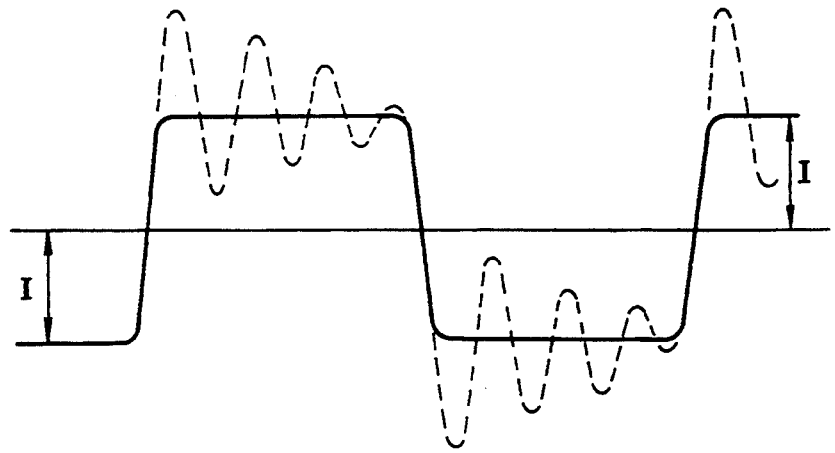
FIG. 3 is a view showing a vibration phenomenon of current flowing through a chief coil $L_H$ shown in FIG. 2.
Figure 4:
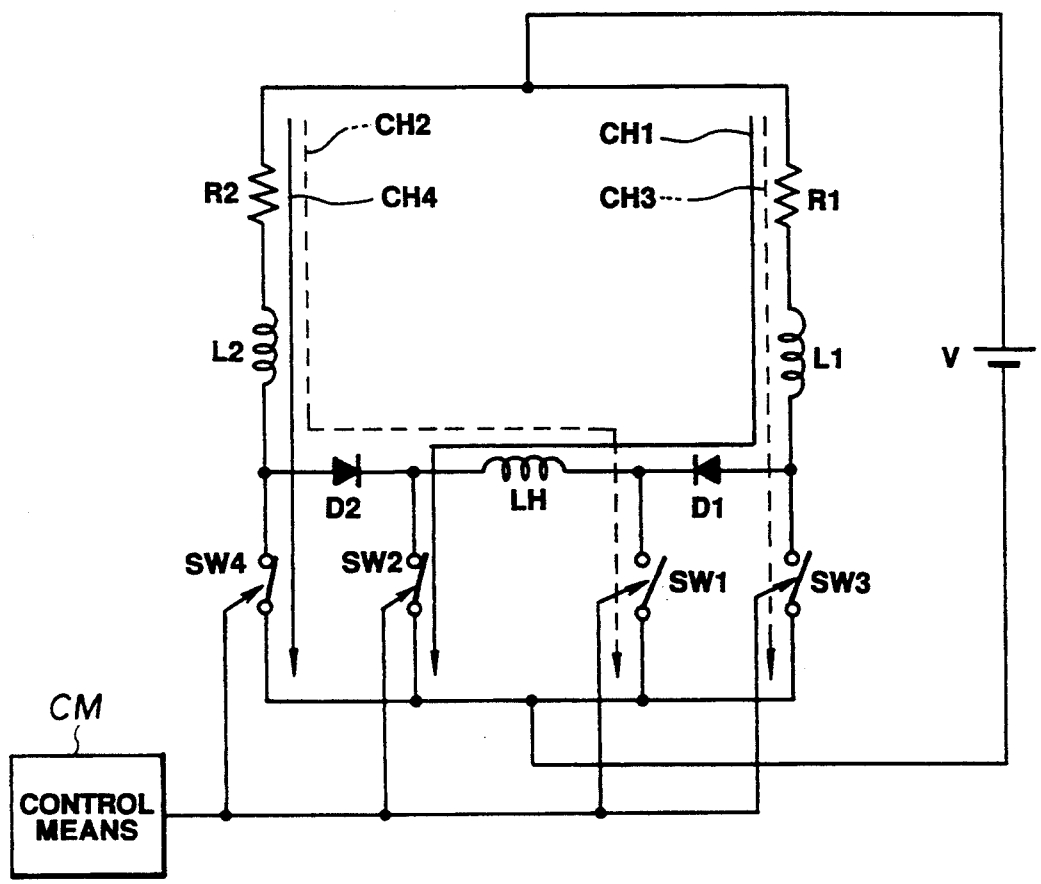
FIG. 4 is a circuit diagram showing a magnetic head driving apparatus of a first preferred embodiment of the present invention.

Preferred embodiments of the present invention will be explained with reference to the drawings. FIG. 4 is a circuit diagram showing a first preferred embodiment of a magnetic head driving apparatus of the present invention. In FIG. 4, the same portions as those shown in the prior art apparatus of FIG. 2 are designated by the same reference symbols as those in FIG. 2. In FIG. 4, reference symbol $L_H$ designates a chief coil of a magnetic head wound around a magnetic core (not shown), and reference symbols $L_1$ and $L_2$ respectively designate auxiliary coils. The inductances of the auxiliary coils $L_1$ and $L_2$ are set to values larger than the inductance of the chief coil $L_H$. Further, reference symbols $SW_1$–$SW_4$ respectively designate switch elements such as field effect transistors, reference symbols $D_1$ and $D_2$ designate rectification elements (connection elements) such as semiconductor diodes, and reference symbols $R_1$ and $R_2$ designate resistors for current limitation. In this embodiment, pairs of the switch elements $SW_1$ and $SW_3$ and the switch elements $SW_2$ and $SW_4$ respectively operate at the same time as a pair, and the switch elements $SW_1$ and $SW_3$ and the switch elements $SW_2$ and $SW_4$ are alternately on-off controlled by a control means CM.

Initially, in a state wherein the switch elements $SW_2$ and $SW_4$ are closed and the switch elements $SW_1$ and $SW_3$ are open, current paths $CH_1$ and $CH_4$ indicated by solid lines are established or closed and currents are respectively supplied to the chief coil $L_H$ and the auxiliary coil $L_1$ through path $CH_1$ and to the auxiliary coil $L_2$ through path $CH_4$. In this case, the current of the chief coil $L_H$ is approximately equal to that of the auxiliary coil $L_1$, and the current of the current path $CH_1$ through the chief coil $L_H$ would not flow into the current path $CH_4$ since it is stopped by the rectification element $D_2$. Further, since the rectification element $D_2$ has a potential difference, the current of the current path $CH_4$ would not flow into the current path $CH_1$. Thus, the switch element $SW_4$, which establishes current path $CH_4$, and the rectification element $D_2$ effectively isolate current patent $CH_4$ from current path $CH_1$.

Next, when the switch elements $SW_1$ and $SW_3$ are closed and the switch elements $SW_2$ and $SW_4$ are opened, current paths $CH_2$ and $CH_3$ indicated by dashed lines are closed and currents are respectively supplied to the chief coil $L_H$ and the auxiliary coil $L_2$ through path $CH_2$ and to the auxiliary coil $L_1$ through path $CH_3$. The direction of current through the chief coil $L_H$ is reversed, and the current of the chief coil $L_H$ is approximately equal to that of the auxiliary coil $L_2$. Further, the current of the current path $CH_2$ would not flow into the current path $CH_3$ and the current of the current path $CH_3$ would not flow into the current path $CH_2$ for the same reason as stated above. i.e., due to the rectification element $D_1$.

As has been described in the foregoing, in a circuit apparatus for driving a magnetic head of the present invention, a bridge circuit is constructed in which a chief coil for generating a magnetic field is arranged between a first connection node disposed between a serially connected first auxiliary coil and first switch element and a second connection node disposed between a serially connected second auxiliary coil and second switch element, and the magnetic field is modulated in accordance with an information signal by on-off control of the first and second switch elements to change the direction of current flowing in the chief coil. Further, third and fourth switch elements are respectively connected in parallel with the first and second switch elements so that a current path of the chief coil is separated from respective current paths of the auxiliary coils by using respective rectification elements for preventing a reverse current from the chief coil. Thus, the current path of current through the auxiliary coil can be isolated.

The time required for reversing the current of the chief coil $L_H$ is approximately determined by a period of the vibration caused by a stray capacitance (a capacitance between a drain and a source when the switch element is a field effect transistor) of the switch element and the inductance of the chief coil $L_H$, as described above. In this case, but for the rectification elements $D_1$ and $D_2$, a configuration in which two switch elements are connected in parallel would appear to double its stray capacitance and the reversal time of the supply current in the chief coil $L_H$ would be prolonged. In this embodiment, however, since the rectification elements $D_1$ and $D_2$ are respectively connected between the switch elements $SW_1$ and $SW_3$ and the switch elements $SW_2$ and $SW_4$, the effect of capacitances of the newly added switch elements $SW_3$ and $SW_4$ can be lessened when the capacitance of the rectification element (a junction capacitance if the rectification element is a diode) is small. Thus, the reversal time of current in the chief coil $L_H$ will not be long. Further, in this embodiment, since currents of the chief coil and the auxiliary coil are respectively caused to flow in different current paths, the current of the switch element is half as much as that in the prior art and a switch element having a small capacitance can be used accordingly. This results in the technical advantage that the current reversal time of the chief coil is reduced because the stray capacitance of the switch element can be lowered (a drain-source capacitance is made small if the switch element is a field effect transistor). In addition, since energy consumed by the respective switch elements becomes one-fourth of the energy consumed by the prior art, it is well suited to a design in which consideration of heat radiation is important at the time of packaging the switch element.

In the above embodiment, while the switch elements $SW_1$ and $SW_3$ and the switch elements $SW_2$ and $SW_4$ are respectively on-off controlled at the same time, the prior art problem that the current of the chief coil is reduced when a high driving frequency is used can be solved if the switch element $SW_4$ is opened a short predetermined time after the opening of the switch element $SW_2$ and the switch element $SW_3$ is opened a short predetermined time after the opening of the switch element $SW_1$. In the prior art apparatus, when the switch element is opened, the vibration phenomenon of current occurs due to the inductance of the chief coil and the capacitance of the switch element, and at the same time a necessary current is momentarily supplied from the auxiliary coil to the chief coil. At this time, the current is concentrated to the chief coil, and as a result, the energy ($\frac{1}{2} \cdot LI^2$) that the chief coil originally has and that is a source of the current vibration phenomenon becomes excessive. Therefore, in order to speedily reduce the vibration, the excessive energy must be consumed by a resistor or the like, and on the other hand, the amount of reduced energy must be restored to the auxiliary coil by the next current reversal. Therefore, in this preferred embodiment, timing is controlled so that the switch element $SW_3$ is opened after the switch element $SW_1$ is opened and the switch element $SW_4$ is opened after the switch element $SW_2$ is opened, and hence the current supply from the auxiliary coil to the chief coil is delayed. Thus, the amplitude of the current vibration is greatly reduced compared with the prior art, and the generation of excessive energy in the chief coil is suppressed.

Figure 5:
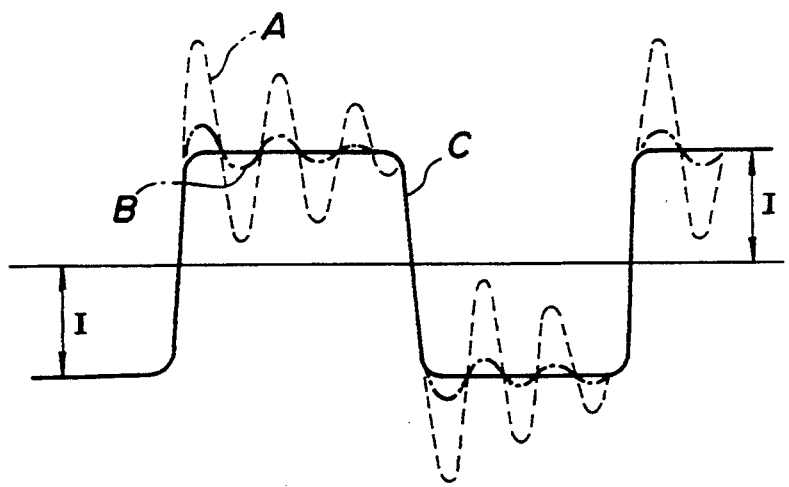
FIG. 5 is a view showing a vibration phenomenon of current flowing through a chief coil $L_H$ shown in FIG. 4 according to the present invention.

The time delay between opening of the switch elements $SW_1$ and $SW_3$ and between opening of the switch elements $SW_2$ and $SW_4$ is preferably about one-half of the vibration period at which the reversed current is maximum. According to an experiment conducted under the above condition, it was confirmed that the current vibration was less than a third of that of the prior art. FIG. 5 shows a current wave shape of the chief coil obtained in that experiment, where A indicates a prior art current vibration and B indicates the current vibration obtained when the off-timing of the switch elements is shifted as discussed above. From FIG. 5, it is seen that the amplitude of the current vibration is extremely reduced as compared to the prior art. In actuality, in order to speedily reduce the current vibration as shown by C of FIG. 5, the excessive energy is consumed by the resistor or the like and the energy of the same magnitude is supplied to the auxiliary coil by the next current reversal. Since the consumption of energy accompanying one current reversal of the chief coil is lessened by shifting the off-timing of the above-mentioned pairs of the switch elements, the shortage of current in the chief coil would not occur, and hence the chief coil can be driven at a higher driving frequency. According to an experiment conducted by the applicant, an upper limit of the driving frequency was 10 MHz when the voltage of a DC source V was 5V, the inductance of the chief coil $L_H$ was 1 μH and its current was 0.2A. Thus, it was confirmed that the driving frequency was greatly increased as compared with the frequency of 5 MHz that is an upper limit of the prior art driving frequency.

Figure 6A:
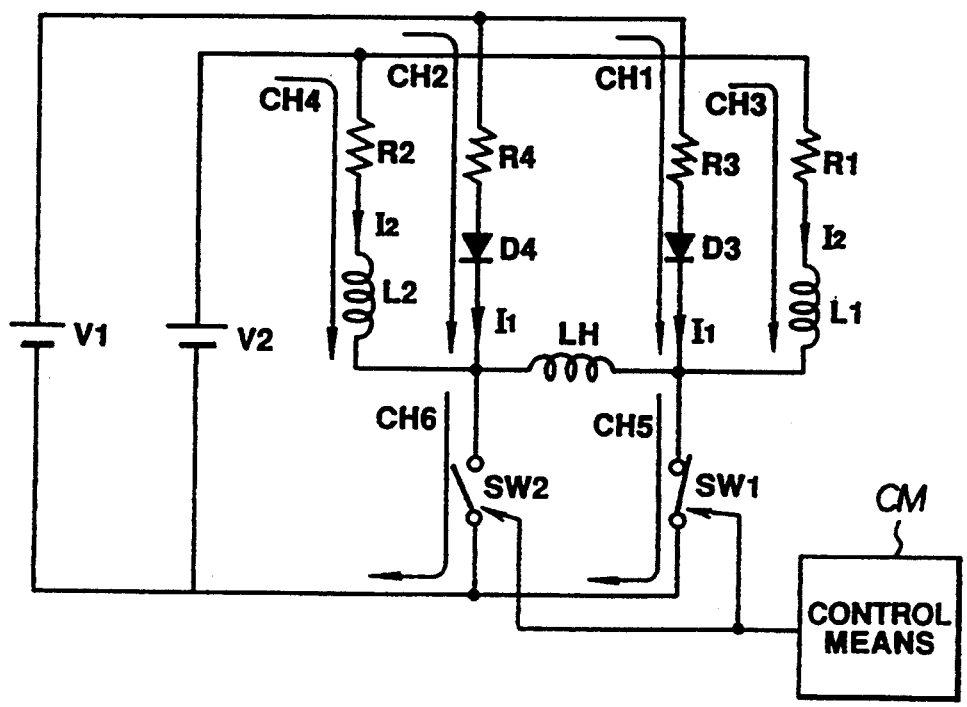
FIGS. 6A and 6B are circuit diagrams showing a magnetic head driving apparatus of a second preferred embodiment of the present invention.
Figure 6B:
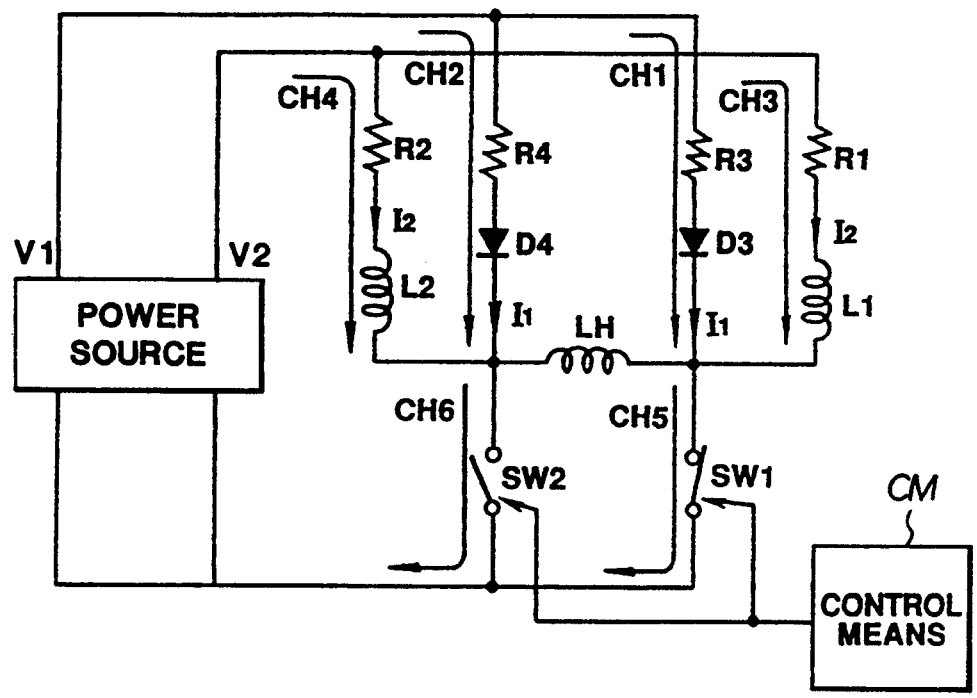

FIGS. 6A and 6B are circuit diagrams showing a second preferred embodiment of a magnetic head driving apparatus of the present invention. In FIG. 6A, reference sign $V_1$ designates a DC source of, for example, 5V, and reference sign $V_2$ designates a DC source of, for example, 12V that is greater than that of the DC source FIG. 6B shows a common power source. In FIG. 6A, the DC source $V_1$ is connected to a switch element $SW_1$ through a resistor $R_3$ and a rectification element $D_3$ such as a diode, and is connected to a switch element $SW_2$ through a resistor $R_4$ and a rectification element $D_4$. A circuit comprising the resistor $R_3$ and the rectification element $D_3$ and a circuit comprising the resistor $R_4$ and the rectification element $D_4$ respectively change their impedances when the switch elements $SW_1$ and $SW_2$ are changed over, so that the current vibration of the chief coil $L_H$ is reduced. This will be explained in more detail below. The remaining construction is the same as that of FIG. 2, and reference symbol $L_H$ designates a chief coil wound around a magnetic core (not shown), reference symbol $L_1$ and $L_2$ designate auxiliary coils, and reference symbol $SW_1$ and $SW_2$ designate switch elements such as a field effect transistor which are alternately on-off controlled. The inductances of the auxiliary coils $L_1$ and $L_2$ are set to values larger than the inductance of the chief coil $L_H$.

The operation of this embodiment will be described. Initially, when the switch element $SW_1$ is closed and the switch element $SW_2$ is open, a path from the DC source $V_1$ to the current paths $CH_1$ and $CH_5$, a path from the DC source $V_1$ to the current path $CH_5$ through the current path $CH_2$ and the chief coil $L_H$, a path from the DC source $V_2$ to the current paths $CH_3$ and $CH_5$ and a path from the DC source $V_2$ to the current path $CH_5$ through the current path $CH_4$ and the chief coil $L_H$ are respectively established. At this time, it is assumed that current flowing in each of the current paths $CH_1$ and $CH_2$ is $I_1$ and current flowing in each of the current paths $CH_3$ and $CH_4$ is $I_2$. In this state, when the switch element $SW_1$ is opened and the switch element $SW_2$ is closed, the current path $CH_5$ is opened and the current path $CH_6$ is closed. Here, since the inductance of the auxiliary coils $L_1$ and $L_2$ is large, the current of the current paths $CH_3$ and $CH_4$ remains approximately constant, but a high voltage is momentarily induced between the auxiliary coil $L_1$ and the chief coil $L_H$. Therefore, a reverse bias voltage is applied to the rectification element $D_3$, and hence the current path $CH_1$ is momentarily opened and has a high impedance.

On the other hand, the current flowing in the current path $CH_3$ is approximately maintained at a constant value $I_2$, and its flow path is changed from the current path $CH_5$ to the chief coil $L_H$ in a very short time. Further, since magnetic energy of $\frac{1}{2} \cdot LI^2$ ($I = I_1 + I_2$) is originally stored in the chief coil $L_H$, the above-discussed vibration phenomenon of current occurs due to the inductance of the chief coil $L_H$, the capacitance of the switch element and the like. In this case, after a time lapse of one-half of a period of the current vibration, current flowing in an opposite direction through the chief coil $L_H$ reaches a maximum whose value is $I_1 + I_2 - \Delta I$. $\Delta I$ is an amount of current reduction due to the energy loss at the time of one-half of the period of the vibration, and amounts to about 20% of $I_1 + I_2$. On the other hand, the constant current $I_2$ is momentarily supplied from the current path $CH_3$ to the chief coil $L_H$, and hence current flowing into the chief coil $L_H$ at this time becomes equal to $I_1 + 2I_2 - \Delta I$. Here, if $I_2 \approx \Delta I$ is established, current flowing into the chief coil $L_H$ becomes equal to $I_1 + I_2$. This value is the same as that before the switch element $SW_1$ is opened and the switch element $SW_2$ is closed (its direction is opposite).

Further, when current flowing in the chief coil $L_H$ in an opposite direction is maximum, a voltage induced between the auxiliary coil $L_1$ and the chief coil $L_H$ is lowered and the reverse bias voltage across the rectification element $D_3$ is eliminated. As a result, the momentarily opened current path $CH_1$ is closed and its impedance is changed from high to low. Thus, the vibration phenomenon of current flowing in the chief coil $L_H$ will not continue any longer. Thereafter, a total current of $I_1 + I_2$, From the current path $CH_1$ of low impedance and the current path $CH_3$, respectively, is continuously supplied to the chief coil $L_H$, and thus the reversal of current is completed. Further, in a case when the switch element $SW_2$ is opened and the switch element $SW_1$ is closed, i.e., the reverse of the operation discussed above, the operation is completely the same as above. Namely, the current vibration is suppressed due to the change of the current path $CH_2$ from high impedance to low impedance.

As has been described in the foregoing, in a circuit apparatus for driving a magnetic head of the present invention, a bridge circuit is constructed in which a chief coil for generating a magnetic field is arranged between a first connection node disposed between a serially connected first auxiliary coil and first switch element and a second connection node disposed between a second auxiliary coil and second switch element, and the magnetic field is modulated in accordance with an information signal by on-off control of the first and second switch elements to change the direction of current flowing in the chief coil. Further, circuits for respectively supplying currents to the chief coil through the first and second auxiliary coils and other circuits for respectively supplying currents to the chief coil without passing through the first and second auxiliary coils are constructed. In the other circuits, rectification elements are respectively arranged so that no current flows in an opposite direction.

The other circuits constitute an impedance changing means for changing an output side impedance of the chief coil from high to low after a predetermined time from the current change-over (switch-over of the switch elements $SW_1$ and $SW_2$) when currents are respectively supplied to the chief coil.

The impedance changing means is comprised of a rectification element whose impedance changes to a low impedance when a reverse bias voltage due to a reverse electromotive force of each of the first and second auxiliary coils is eliminated.

The impedance changing means is comprised of a switch element which is controlled such that the switch is closed in a predetermined time after the direction of a current of the chief coil is changed over.

The first and second auxiliary coils and the impedance changing means are driven separately by respective DC sources, and the voltage of the DC source of the first and second auxiliary coils is set to a value larger than that of the DC source of the impedance changing means.

The impedance changing means changes its impedance From high to low in approximately one-half of a current vibration period after the current is changed over. This period is determined by the inductance of the chief coil and the capacitance in the vicinity of the chief coil.

In this embodiment, when the current of the chief coil is reversed, all of the magnetic energy originally stored in the chief coil is not consumed, but only energy corresponding to a current decrease or reduction ΔI (about 20% of I) is consumed during one-half of the period of the current vibration. After that, the current vibration of the chief coil is terminated by supplying current to the chief coil from the current path whose impedance is changed to low. Thus, the energy consumption of the chief coil can be lowered. As a result, since the amount of energy supplemented by the auxiliary coil can be small, its supplement time can be short and the driving frequency can be enhanced. In this case, the voltage of the DC source $V_2$ of the auxiliary coils can be made high, for example, 12V (in the prior art, generally 5V) such that the energy supplementing can be quickened and the driving frequency can be further increased. Here, even if the voltage of the auxiliary coil is increased, the current $I_2$ supplied from the auxiliary coil is approximately equal to ΔI, i.e., 20% of I, and so a consumed power of the apparatus will not rise greatly. Further, although two sources are used in this embodiment to increase the voltage of the auxiliary coil, a single source of, for example, 5V, can adequately attain the advantage that the driving frequency can be increased.

Figure 7A:
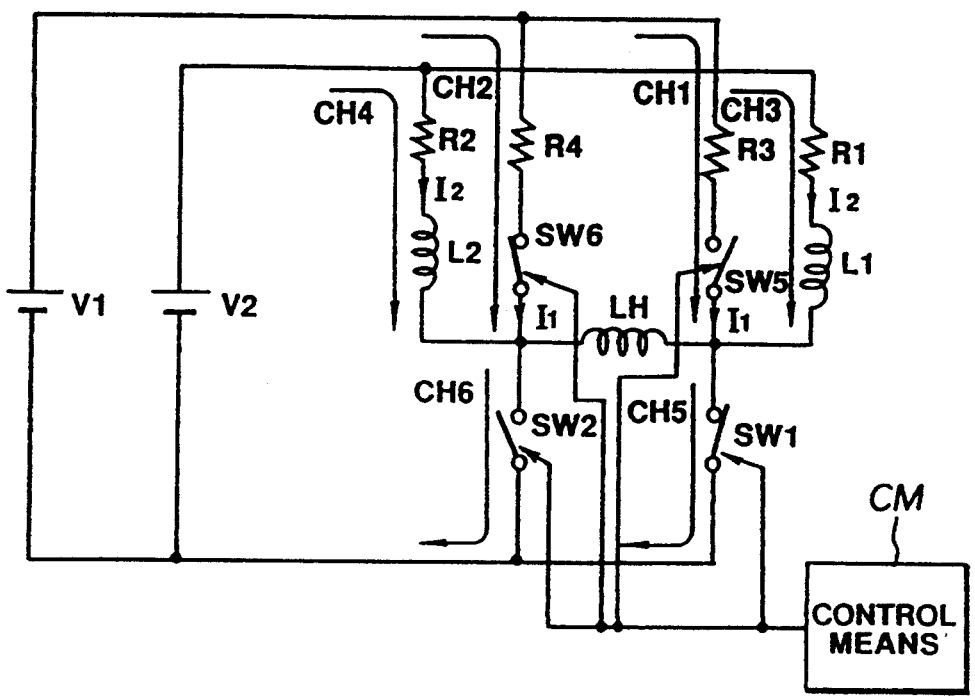
FIGS. 7A and 7B are circuit diagrams showing a magnetic head driving apparatus of a third preferred embodiment of the present invention.
Figure 7B:
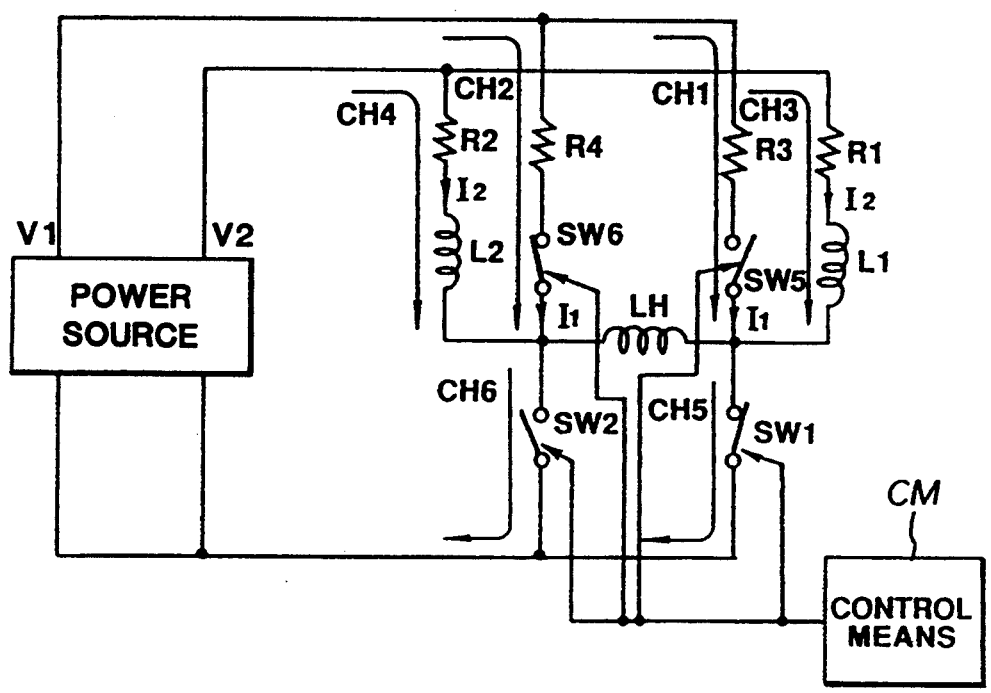

FIGS. 7A and 7B are circuit diagrams showing a third preferred embodiment of a magnetic head driving apparatus of the present invention. While the rectification elements are arranged in the energy supply circuit for supplying the chief coil without including the auxiliary coil, in the embodiment of FIGS. 6A and 6B, switch elements $SW_5$ and $SW_6$, such as field effect transistors, are disposed in place of the rectification elements in the third embodiment. The energy supply can effectively be performed by controlling those switch elements with an appropriate timing. The basic operation of this embodiment is the same as that of the embodiment of FIGS. 6A and 6B.

When the switch element $SW_1$ is closed and the switch element $SW_2$ is opened, the switch element $SW_5$ is opened and the switch element $SW_6$ is closed and the current path $CH_1$ is opened differently from the embodiment of FIGS. 6A and 6B. In this state, when the switch elements $SW_1$ and $SW_6$ are opened and the switch element $SW_2$ is closed, current is supplied to the chief coil $L_H$ from the current path $CH_3$ and current is supplied to the auxiliary coil $L_2$ by the current path $CH\&_4$. At this time, as mentioned above, the current vibration occurs due to the magnetic energy stored in the chief coil $L_H$, and the current flowing into the chief coil $L_H$ due to the vibration becomes maximum $(I_1+I_2-\Delta I)$ after one-half of the vibration period. Further, since the current $I_2$ is supplied to the chief coil $L_H$ from the current path $CH_3$, current supplied to the chief coil $L_H$ is $I_1+2I_2-\Delta I$. Here, if $I_2 \approx \Delta I$ is established, the supplied current becomes equal to $I_1+I_2$. Since the switch element $SW_5$ is closed at the time of that maximum value and the current path $CH_1$ is closed as described above to change its impedance from high to low, the current vibration is terminated and the current $I_1$ is supplied from the current path $CH_1$ to the chief coil $L_H$. Thus, the current $I_1$ and the current $I_2$ from the auxiliary coil $L_1$ are supplied to the chief coil $L_H$, and the reversal of current is completed. The switch element $SW_6$ at the other side operates in the same way, and the impedance of the current path $CH_2$ is changed to low at the time of the current reversal of the chief coil $L_H$. As a result, the current vibration of the chief coil $L_H$ is suppressed.

Thus, in this embodiment, since the current vibration of the chief coil is suppressed by controlling the on-off state of the switch elements $SW_5$ and $SW_6$, wasteful consumption of the magnetic energy of the chief coil can be prevented in a manner similar to the above-discussed embodiments. Therefore, the energy supplementing time of the auxiliary coil can be short, and so the driving frequency can be increased. Further, while the current path is opened only when the reverse bias voltage is applied to the rectification element in the embodiment of FIGS. 6A and 6B, the switch elements $SW_5$ and $SW_6$ are controlled to be closed by an external control circuit only when necessary in this embodiment. So, no wasteful current is supplied, and as a result a consumed power of the apparatus can further be reduced compared with the embodiment of FIGS. 6A and 6B. According to an experiment, the power reduction was 10–20% as compared with the prior art apparatus.

As described in the foregoing, in the present invention, the driving frequency of a magnetic head can greatly be increased as compared with the prior art. As a result, a recording speed of information can be extremely enhanced.

The individual components shown in outline or designated by blocks in the Drawings are all well-known in the optomagnetic recording apparatus arts and their specific construction and operation are not critical to the operation or best mode for carrying out the invention.

While there has been shown and described what are considered preferred embodiments of the present invention, it will be understood by those skilled in the art that various changes and modifications may be made therein without departing from the invention as defined by the following claims.

What is claimed is:

1. A circuit apparatus for generating a magnetic field for driving a magnetic head, said apparatus comprising:
   a first auxiliary coil for supplying a first current;
   a first switch element serially connected to said first auxiliary coil through a first connection element;
   a second auxiliary coil for supplying a second current;
   a second switch element serially connected to said second auxiliary coil through a second connection element;
   a chief coil for generating the magnetic field to drive the magnetic head, said chief coil being connected between first and second switch element sides of the first and second connection elements, respectively, and wherein said first switch element establishes a path for the second current through said chief coil, and said second switch element establishes a path for the first current through said chief coil;
   a third switch element, connected to said first auxiliary coil and to said first switch element in parallel, for establishing a path for the first current separate from said chief coil; and
   a fourth switch element, connected to the second auxiliary coil and to said second switch element in parallel, for establishing a path for said second current separate from said chief coil.

2. A circuit apparatus according to claim 1, wherein said first and second connection elements each comprise rectification elements for blocking a reverse current from said chief coil.

3. A circuit apparatus according to claim 1, wherein said first and second connection elements each comprise switching elements.

4. A circuit apparatus according to claim 1, further comprising control means for switching said first and third switch elements to an open state and, at substantially the same time, switching said second and fourth switch elements to a closed state.

5. A circuit apparatus according to claim 4, wherein said control means further comprises means for switching said first switch element to an open state just prior to switching said third switch element to an open state and means for switching said second switch element to an open state just prior to switching said fourth switch element to an open state.

6. A circuit apparatus for generating a magnetic field for driving a magnetic head, said apparatus comprising:
   a first auxiliary coil for supplying a first current;
   a first switch element serially connected to said first auxiliary coil at a first connection node;
   a second auxiliary coil for supplying a second current;
   a second switch element serially connected to said second auxiliary coil at a second connection node;
   a chief coil for generating the magnetic field to drive the magnetic head, said chief coil being connected between the first and second connection nodes, and wherein said first switch element establishes a path for the second current through said chief coil, and said second switch element establishes a path for the first current through said chief coil;
   a first supply circuit for supplying current to said first auxiliary coil;
   a second supply circuit for supplying current to said second auxiliary coil;
   a third supply circuit connected to said first switch element in parallel with said first auxiliary coil for supplying current to said chief coil; and
   a fourth supply circuit connected to said second switch element in parallel with said second auxiliary coil for supplying current to said chief coil.

7. A circuit apparatus according to claim 6, wherein said third supply circuit and said fourth supply circuit each comprise a rectification element.

8. A circuit apparatus according to claim 6, wherein said third supply circuit and said fourth supply circuit each comprise a switch element.

9. A circuit apparatus according to claim 6, wherein said first, second, third and fourth supply circuits include a common power source.

10. A circuit apparatus according to claim 6, wherein said first and second supply circuits include a first power source and said third and fourth supply circuits include a second power source.

11. A circuit apparatus for generating a magnetic field for driving a magnetic head, said apparatus comprising:
    chief coil means for generating the magnetic field;
    switch means for switching a direction of current in said chief coil means;
    auxiliary coil means for supplementing the energy of the chief coil means at a time when switching occurs; and
    isolation means for establishing a current path through said auxiliary coil means separate from a current path through said chief coil means.

12. A circuit apparatus according to claim 11, wherein said isolation means comprises rectification means for blocking a reverse current from said chief coil means.

13. A circuit apparatus according to claim 11, wherein said isolation means comprises switch means for controlling current through said auxiliary coil means.

14. A circuit apparatus according to claim 1, further comprising control means for (i) switching said first and third switch elements to an open state and, at substantially the same time, switching said second and fourth switch elements to a closed state and (ii) switching said first and third switch elements to a closed state and, at substantially the same time, switching said second and fourth switch elements to an open state.

15. A circuit apparatus according to claim 1, wherein said apparatus is used for driving a magnetic head in a magnetic modulation type optomagnetic recording apparatus.

16. A circuit apparatus according to claim 6, wherein said apparatus is used for driving a magnetic head in a magnetic modulation type optomagnetic recording apparatus.

17. A circuit apparatus according to claim 11, wherein said apparatus is used for driving a magnetic head in a magnetic modulation type optomagnetic recording apparatus.

18. A circuit apparatus for generating a magnetic field for driving a magnetic head, said apparatus comprising:
    a first auxiliary coil;
    a first switch element serially connected to said first auxiliary coil through a first connection element;
    a second auxiliary coil;
    a second switch element serially connected to said second auxiliary coil through a second connection element;
    a chief coil for generating the magnetic field to drive the magnetic head, said chief coil being connected between first and second switch element sides of the first and second connection elements;
    a third switch element, connected to said first auxiliary coil and to said first switch element in parallel;
    a fourth switch element, connected to said second auxiliary coil and to said second switch element in parallel; and
    control means for (i) switching said first and third switch elements to an open state and, at substantially the same time, switching said second and fourth switch elements to a closed state and (ii) switching said first and third switch elements to a closed state and, at substantially the same time, switching said second and fourth switch elements to an open state.

19. A circuit apparatus according to claim 18, wherein said first and second connection elements each comprise rectification elements for blocking a reverse current from said chief coil.

20. A circuit apparatus according to claim 18, wherein said first and second connection elements each comprise switch elements.

21. A circuit apparatus according to claim 18, wherein said apparatus is used for driving a magnetic head in a magnetic modulation type optomagnetic recording apparatus.

22. A circuit apparatus for generating a magnetic field for driving a magnetic head, said apparatus comprising:
- a first auxiliary coil;
- a first switch element serially connected to said first auxiliary coil at a first connection node;
- a second auxiliary coil;
- a second switch element serially connected to said second auxiliary coil at a second connection node;
- a chief coil for generating the magnetic field to drive the magnetic head, said chief coil being connected between the first and second connection nodes;
- a first supply circuit for supplying current to said first auxiliary coil;
- a second supply circuit for supplying current to said second auxiliary coil;
- a third supply circuit connected to said first switch element in parallel with said first auxiliary coil for supplying current to said chief coil; and
- a fourth supply circuit connected to said second switch element in parallel with said second auxiliary coil for supplying current to said chief coil.

23. A circuit apparatus according to claim 22, wherein said third supply circuit and said fourth supply circuit each comprise a rectification element.

24. A circuit apparatus according to claim 22, wherein said third supply circuit and said fourth supply circuit each comprise a switch element.

25. A circuit apparatus according to claim 22, wherein said first, second, third and fourth supply circuits include a common power source.

26. A circuit apparatus according to claim 22, wherein said first and second supply circuits include a first power source and said third and fourth supply circuits include a second power source, respectively.

27. A circuit apparatus according to claim 22, wherein said apparatus is used for driving a magnetic head in a magnetic modulation type optomagnetic recording apparatus.

* * * * *

UNITED STATES PATENT AND TRADEMARK OFFICE
CERTIFICATE OF CORRECTION

PATENT NO. : 5,377,055
DATED : December 27, 1994
INVENTOR(S) : Kazuyoshi ISHII

It is certified that error appears in the above-indentified patent and that said Letters Patent is hereby corrected as shown below:

COLUMN 1:

Line 52, "symbol" should read --symbols--;
Line 54, "symbol" should read --symbols--; and
Line 56, "symbol" should read --symbols--.

COLUMN 3:

Line 5, "inadequate." should read --is inadequate.--.

COLUMN 8:

Line 66, "From" should read --from--.

COLUMN 9:

Line 51, "CH&$_4$." should read --CH$_4$.--.

UNITED STATES PATENT AND TRADEMARK OFFICE
CERTIFICATE OF CORRECTION

PATENT NO. : 5,377,055

DATED : December 27, 1994

INVENTOR(S) : Kazuyoshi ISHII

It is certified that error appears in the above-indentified patent and that said Letters Patent is hereby corrected as shown below:

COLUMN 10:

Line 65, "the second" should read --said second--.

Signed and Sealed this

Thirtieth Day of May, 1995

Attest:

BRUCE LEHMAN

*Attesting Officer*  *Commissioner of Patents and Trademarks*